(12) United States Patent
Chiang et al.

(10) Patent No.: US 8,378,742 B2
(45) Date of Patent: Feb. 19, 2013

(54) DRIVER FOR A SEMICONDUCTOR CHIP

(75) Inventors: Renjeng Chiang, Taipei (TW);
Yung-Chow Peng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 121 days.

(21) Appl. No.: 12/987,464

(22) Filed: Jan. 10, 2011

(65) Prior Publication Data

US 2012/0176193 A1    Jul. 12, 2012

(51) Int. Cl.
*H01L 25/00* (2006.01)

(52) U.S. Cl. .................................. 327/566; 327/112

(58) Field of Classification Search .............. 327/108, 327/109, 110, 111, 112, 564, 565, 566
See application file for complete search history.

(56) References Cited

U.S. PATENT DOCUMENTS

| | | | | |
|---|---|---|---|---|
| 6,873,196 | B2 * | 3/2005 | Humphrey | 327/170 |
| 7,248,084 | B2 * | 7/2007 | Huang et al. | 327/108 |
| 8,063,494 | B2 * | 11/2011 | Kitagawa | 257/778 |

* cited by examiner

*Primary Examiner* — Jeffrey Zweizig
(74) *Attorney, Agent, or Firm* — Lowe Hauptman Ham & Berner, LLP

(57) ABSTRACT

A driver for a semiconductor chip, the driver having a drain wire with a first end and a second end and p and n-type transistors each with a source, gate and drain. The source of the p-type transistors connected to a positive power supply line, the source of the n-type transistors connected to a ground power supply line. The gates of the p and n-type transistors connected to a first and second input signals respectively. The drains of the p and n-type transistors connected to the drain wire. The p and n-type transistors arranged so that a difference between a number of n-type transistors connected to the drain wire and a number of p-type transistors connected to the drain wire between the first end of the drain wire and all distances along the drain wire being less than two.

20 Claims, 6 Drawing Sheets

US 8,378,742 B2

DRIVER FOR A SEMICONDUCTOR CHIP

BACKGROUND

Electro-migration is caused if current densities in an electrical wire become great enough to cause the atoms/ions that form the wire to migrate along the wire, i.e., high current density. Specifically, electrons or holes that conduct the current through the wire impart sufficient momentum to atoms/ions in the wire to cause migration of the atoms/ions. With the passage of enough current, the migration of atoms/ions along the wire causes the creation of voids in the wire and accumulation of excess material. The excess material is deposited elsewhere, often at corners in the wiring. The voids cause the current density around each void to increase, thus increasing the rate of electro-migration. The rate of electro-migration is also dependent upon the temperature of the wire. Voids that cause local increases in current density also increase the temperature of the wire due to ohmic heating, thus further increasing the rate of electro-migration. To reduce the effects of electro-migration, wiring of sufficient cross-sectional area is used to prevent an initiation of the electro-migration process. Because of the need to provide sufficient cross-sectional area, wiring on semiconductor chips often consumes large areas of the chip.

As the dimensions of silicon chips have become smaller, currents flowing along the wires have in general also decreased. Further, wiring materials on silicon chips have been modified over the years to accommodate high current densities without causing electro-migration. First, alloys of aluminum were used and more recently the wiring material has been changed to copper. Despite the above modifications, electro-migration is still an issue in high current density carrying parts of a chip. These high current density carrying parts include drivers for driving bond pads connected to wires outside of the silicon chip, power supply wiring on the silicon chip distributing power to the various devices forming the silicon chip and the clock circuit drivers to wires that distribute the clock signal across the silicon chip. In each of these places, high current densities occur and, at least in parts of the driver circuits, the current flow is in one direction. Current flow in one direction is particularly likely to cause electro-migration because the atoms/ions in the wire are constantly pushed in one direction. In wiring that has bidirectional current flow, for example, the clock wiring described above, the atoms/ions in the wire are pushed first one way then back again. Thus, although the atoms/ions move back and forth along the wire, in general, the wire degrades less quickly.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
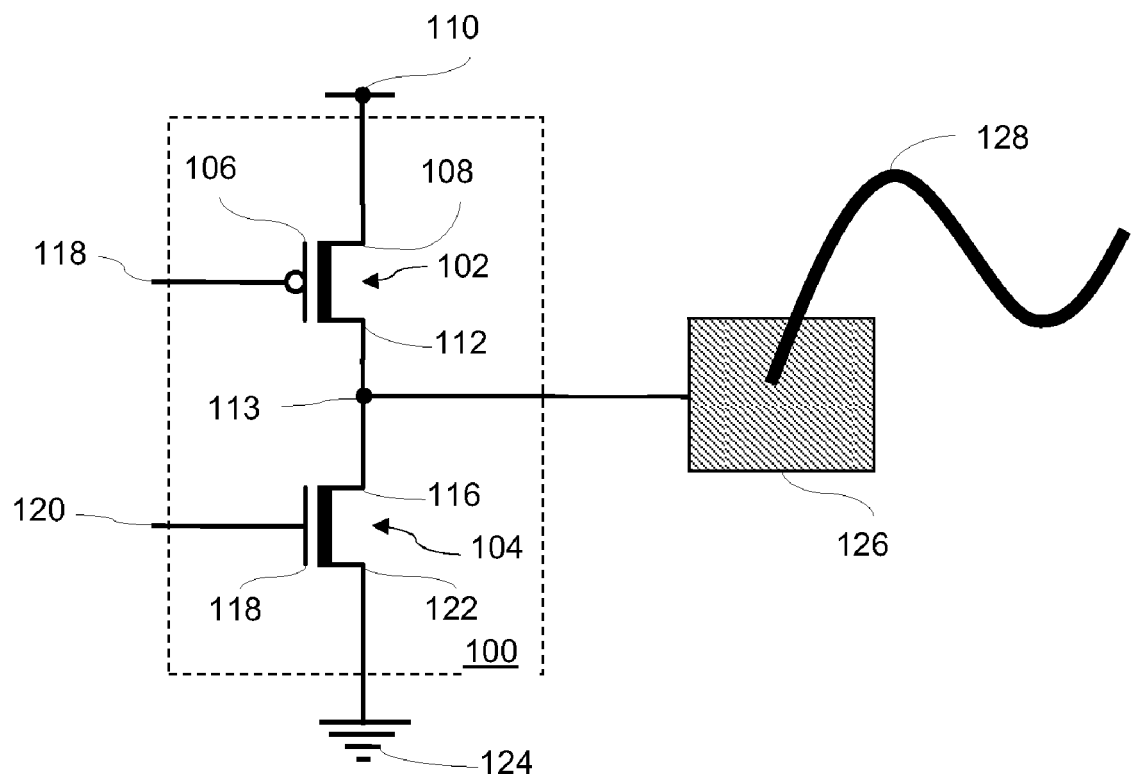
FIG. 1 is a high-level schematic diagram of a driver circuit for a semiconductor chip according to an embodiment.

FIG. 1 is a high-level schematic diagram of a driver circuit 100 according to an embodiment. Driver circuit 100 comprises a p-type driver 102 serially connected with an n-type driver 104. p-type driver 102 has a gate 106, a source 108 connected with a positive power line 110 and a drain 112 connected to a drain 116 of n-type driver 104. Gate 106 is connected with a first input line 118 and drain 112 connects to a node 113 which, in some embodiments, is connected to a bond pad 126 which in turn is bonded to external wiring 128 of a silicon chip on which the driver is formed.

The n-type driver 104 has a gate 118, and a source 122 connected with a ground 124. Gate 118 is connected with a second input line 120 and drain 116 connects to node 113 and thereby to p-type driver 102 via drain 112.

In operation, signals on the first input line 118 and the second input line 120 cause the corresponding p-type driver 102 or n-type driver 104 to connect node 113 to one of the ground power line 124 or the positive power line 110. Current flows to/from either the ground power line 124 or the positive power line 110 connected to the wiring pad to charge or discharge the node 113, the bond pad 126 and external wiring 128 connected to the bond pad 128. In this manner, the bond pad 126 and the external wiring 128 connected to the bond pad switch between a ground voltage (low output state voltage) on the ground power line 124 and a positive supply voltage (high output state voltage) on positive supply line 102.

Figure 2:
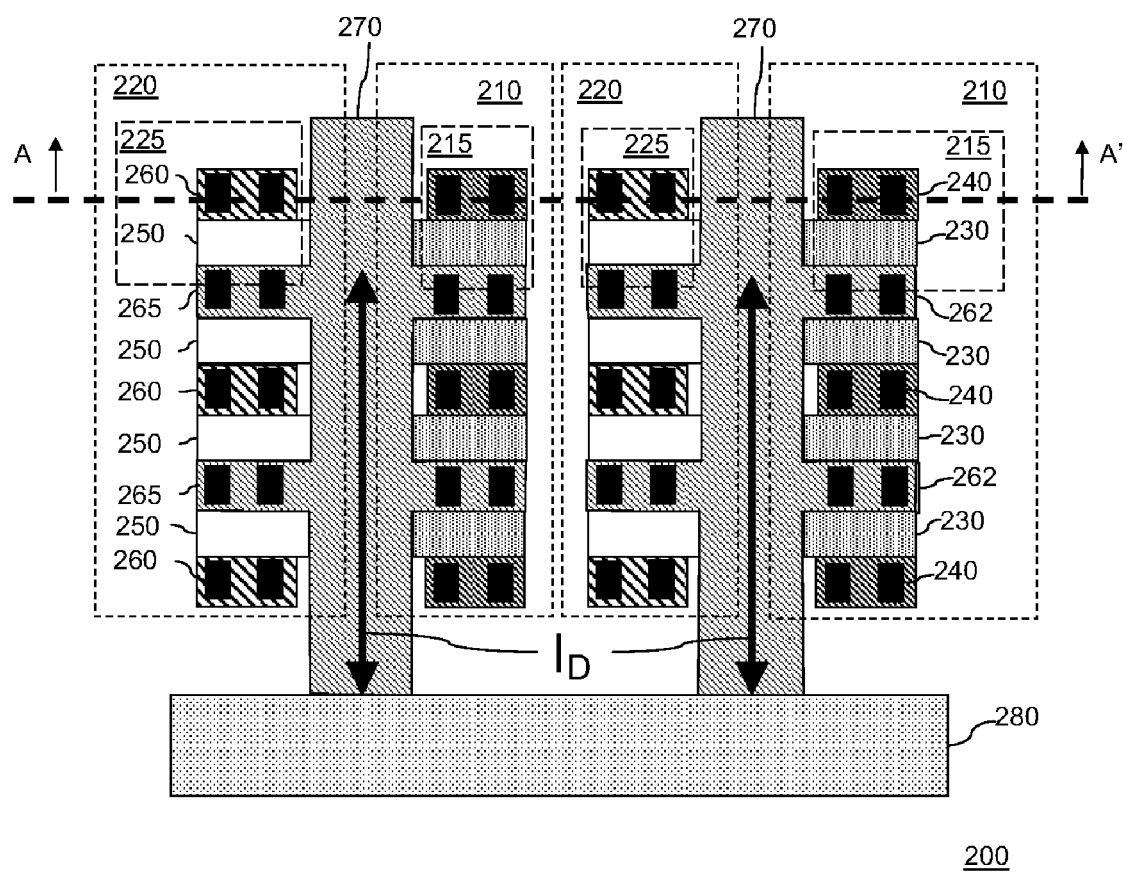
FIG. 2 is a layout diagram corresponding to a layout according to an embodiment of the driver circuit of FIG. 1.

FIG. 2 is a layout diagram 200 corresponding to a layout according to an embodiment of the driver circuit of FIG. 1. The driver circuit layout 200 comprises blocks of p-type MOS transistors 210 comprising, p-type MOS transistors 215. The blocks of p-type MOS transistors 210 collectively form the p-type driver 102 (FIG. 1). The driver circuit layout 200 further comprises blocks of n-type MOS transistors 220 comprising n-type MOS transistors 225. The blocks of n-type MOS transistors 220 collectively form the n-type driver 104 (FIG. 1).

The p-type MOS transistor blocks 210 each comprise gates 230 that collectively form the gate 106 (FIG. 1) and shared source regions 240 that collectively form the source 108 (FIG. 1), the shared source regions connected to positive power line 110 (FIG. 1) and the gates connected to a first input line 118 (FIG. 1).

The n-type MOS transistor blocks 220 each comprise gates 250 that collectively form the gate 118 (FIG. 1) and shared source regions 260 that collectively form the source 122 (FIG. 1), the source regions connected to ground supply wiring 124 (FIG. 1) and the gates connected to a second input line 120 (FIG. 1).

Shared drain regions 265 of the n-type MOS transistors 225 and shared drain regions 262 of the p-type MOS transistors 215 are connected to portions of drain wire 270, formed over the shared drain regions 262, 265. The portions of drain wire 270 that connect to the shared drain regions 262, 265 extend out away from the main portion of the drain wire 270. The drain wires 270 are connected to bond pad wire 280. Each drain wire 270 has a block of p-type MOS transistors 210 on one side and a block of n-type MOS transistors 220 on the other side, each p-type MOS transistor 215 paired with a corresponding one of the n-type MOS transistors 225 directly opposite on the other side of drain wire 270.

In operation, a current $I_D$ flowing along the drain wire 270 is positive when the block of p-type MOS transistors 210 are switched on charging the bond pad wire 280 to the positive supply voltage on the positive power line 102. The current $I_D$ flowing along the drain wire 270 is negative when the n-type MOS transistors 220 are switched on to discharge the bond pad wire 280 to the ground voltage on the ground power line 124. At any point along the drain wire 270, the time average current is approximately zero because current $I_D$ flows in one direction if the block of p-type MOS transistors 210 are switched on and current $I_D$ flows in the opposite direction if the block of n-type MOS transistors 220 are switched on.

To further minimize the electro-migration, in at least one embodiment, the p-type MOS transistors 215 and the n-type MOS transistors 225 have similar on resistance (the on-resistance being the resistance of the MOS transistors when switched on), because then the waveforms of the drive currents in both directions are substantially the same with time. Therefore, the migration of atoms/ions in each direction along the wire are substantially the same.

Figure 3:
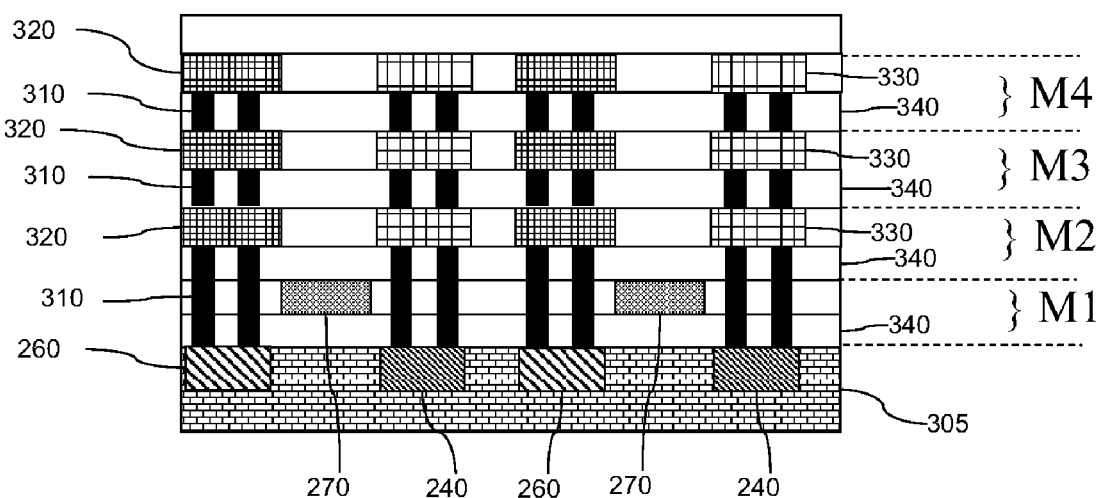
FIG. 3 is a cross-section along the line A-A' of FIG. 2.

FIG. 3 is a cross-section along the line A-A' of FIG. 2. In FIG. 3, metal layers M2-M4 not shown in FIG. 2 are illustrated. The driver circuit layout 200 is fabricated on a substrate 305. The substrate 305 is any substrate suitable for fabrication of semiconductor devices, for example silicon and, in some embodiments, silicon including other elementary semiconductor material such as germanium and carbon. In some embodiments, the substrate 305 also includes a compound semiconductor such as silicon carbide, gallium arsenide, indium arsenide and indium phosphide. In some embodiments, the substrate 305 includes an alloy semiconductor such as silicon germanium, silicon germanium carbide, gallium arsenic phosphide, and gallium indium phosphide. In some embodiments, the substrate 305 comprises P+ type silicon. In some embodiments, the substrate 305 further includes various p-type doped regions and/or n-type doped regions. In some embodiments, substrate 305 includes isolation features (not shown) to separate different devices formed in the substrate 305.

The sources 240, 260 and drains 262 and 265 (not shown in FIG. 3) of the n-type and p-type transistors are formed by p and n type doping of the substrate 305. The gates of the n-type and p-type transistors 230, 250 (not shown in FIG. 3) are formed over the substrate 305. The metal layers M1-M4 and the interlayer dielectric layers 340 together define a multilayer structure in which one or more of drain wire 270, vias and/or plugs 310, positive power supply wiring 320, and ground power supply wiring 330 are formed. The metal layers M1-M4 are formed over the substrate 305 and the gates 230, 250. The vias and/or plugs 310 are formed through the interlayer dielectric layers 340 to connect metal in each of the metal layers M1-M4 and the sources 240, 260, drains 262, 265 and gates 230, 250.

The drain wire 270, vias and/or plugs 310, positive power supply wiring 320 that corresponds to positive power line 110 and ground power supply wiring 330 that corresponds to ground power line 124 are formed from materials such as aluminum, copper, tungsten, titanium, titanium nitride, tantalum, tantalum nitride, metal silicide or combinations thereof. The foregoing features are formed by processes such as physical vapor deposition (or sputtering), chemical vapor deposition (CVD), or combinations thereof. Other manufacturing techniques used to form the drain wire 270, vias and/or plugs 310, positive power supply wiring 320, ground power supply wiring 320 include photolithography processing and etching thermal annealing to form metal silicides. In some embodiments, copper multilayer interconnect is used and includes copper, copper alloy, titanium, titanium nitride, tantalum, tantalum nitride, tungsten, polysilicon, metal silicide, or combinations thereof. In some embodiments, the copper multilayer interconnect is formed by a technique that includes CVD, sputtering, plating, or other suitable processes. Furthermore, in some embodiments, the metal silicide used in multilayer interconnects includes nickel silicide, cobalt silicide, tungsten silicide, tantalum silicide, titanium silicide, platinum silicide, erbium silicide, palladium silicide, or combinations thereof.

The interlayer material dielectric 340 includes, for example, silicon dioxide, silicon nitride, silicon oxynitride, polyimide, spin-on glass (SOG), fluoride-doped silicate glass (FSG), carbon doped silicon oxide, BLACK DIAMOND™ (available from Applied Materials of Santa Clara, Calif.), Xerogel, Aerogel, amorphous fluorinated carbon, Parylene, BCB (bis-benzocyclobutenes), SILK™ (available from Dow Chemical of Midland, Mich.), polyimide, and/or other suitable materials. In some embodiments, interlayer dielectric layer 340 is formed by a technique including spin-on, CVD, sputtering, or other suitable processes. In some embodiments, metal layers M1-M4 are formed in an integrated process including a damascene process such as dual damascene processing or single damascene processing.

The metal layers M2-M4, are connected to the sources 240, 260 via plugs or vias 310. This allows the current densities in the positive power supply wiring 320 and the ground power supply wiring 330 to be kept below the electro-migration limit by increasing the cross-sectional area of the positive power supply wiring 320 and the ground power supply wiring 330. In some embodiments, all of the metal layers are used to form the positive power supply wiring 320 and the ground power supply wiring 330. In other embodiments, a combination of metal layers compatible with embodiments of the disclosure is used to form the positive power supply wiring 320 and the ground power supply wiring 330.

Figure 4:
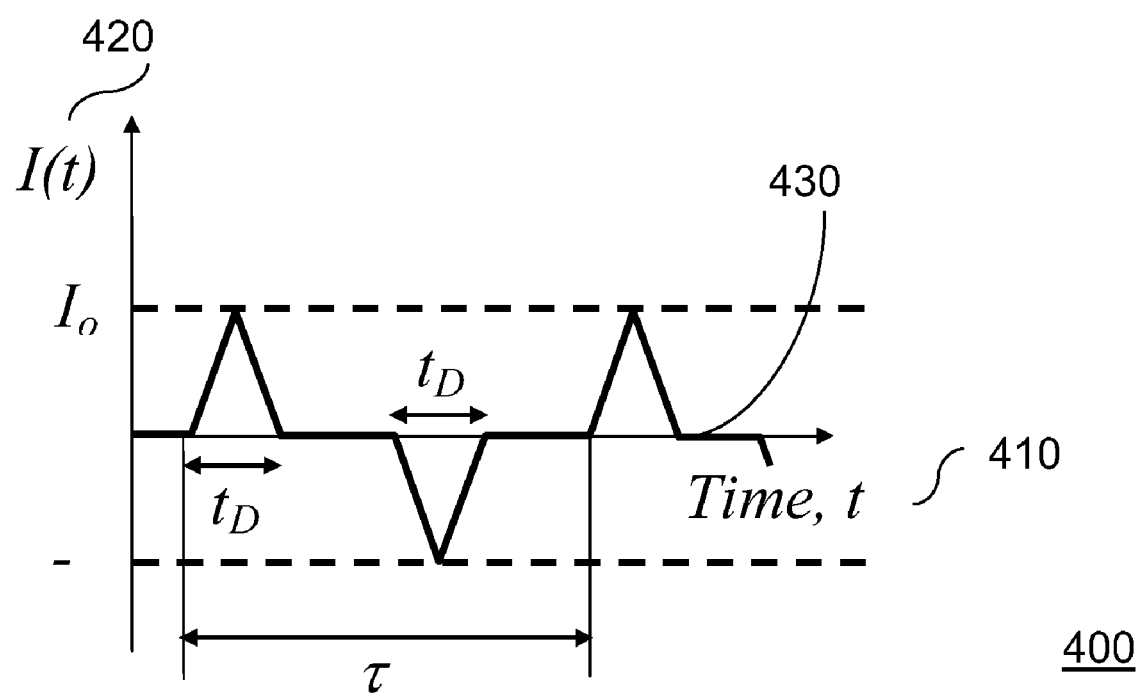
FIG. 4 is a graph of the current through wiring connecting drivers to a bond pad as a function of time for the layout of FIG. 2.

FIG. 4 is a graph 400 of the approximate current versus time for drain wire 270 (FIG. 2) where the drain wire 270 connects to the bond pad wire 280. The x-axis 410 represents the passage of time and the y-axis 420 represents the current in the drain wire 270. The waveform 430 represents the current flowing through the drain wire 270 as the voltage on the wiring pad 280 is switched from ground to the positive power supply voltage and as the voltage on the wiring pad switches from the positive power supply voltage back to ground again. As in FIG. 3, to charge the wiring pad 280, the current rises sharply to a peak $I_0$ then falls sharply back to zero once the pad wiring 280 and the subsequent wiring is charged. To discharge the wiring pad 280, the current falls sharply to a negative peak $-I_0$ then rises sharply back to zero once the wiring pad 280 and the subsequent wiring is discharged. If the width of the charging peak is $t_D$, the time between each charge and discharge is $\tau$ and the current waveform is approximately triangular in shape then the time average current $I_{avg}$ is approximately 0 because in the time period $\tau$ current flows in both directions as in equation (1).

$$I_{avg} = \frac{1}{\tau}\int_0^\tau I(t)dt = \frac{t_D I_0}{2\tau} - \frac{t_D I_0}{2\tau} = 0 \qquad (1)$$

Because the average current is close to zero in the drain wire 270 of FIG. 2, the cross-sectional area required for the drain wire 270 is much lower than the cross-sectional area required if the current flowed in only one direction through the drain wire 270.

The drain wire 270 has to be of large enough cross-sectional are to tolerate power dissipated in the wire due to ohmic heating from the current flow. The ohmic power dissipated in the wire is proportional to the root mean square (RMS) current. For the waveform 430, the RMS current given by equation (2)

$$I_{rms} = \sqrt{\frac{1}{\tau}\int_0^\tau I(t)^2 dt} = 2I_0\sqrt{\frac{t_D}{3\tau}} \quad (2)$$

is $2I_0\sqrt{t_D/3\tau}$. The design rules for ohmic heating due to bidirectional current flow allow RMS current densities more than 10 times greater than the maximum unidirectional currents allowed at chip temperatures of 125° C. due to electro-migration.

Figure 5:
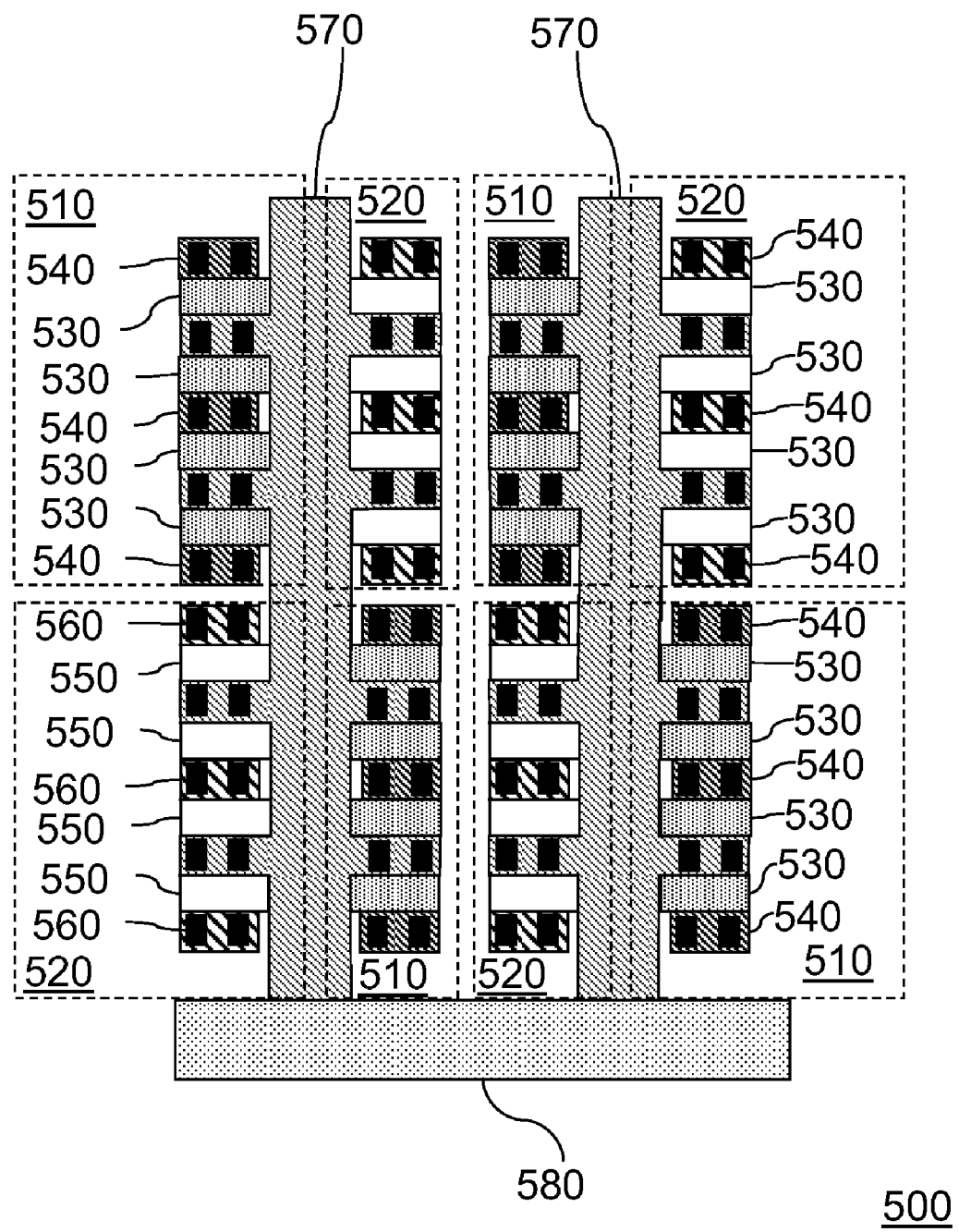
FIG. 5 is a layout diagram corresponding to a layout according to an embodiment of the driver circuit of FIG. 1.

FIG. 5 is a layout diagram 500 corresponding to a layout according to another embodiment of the driver circuit of FIG. 1. The driver circuit layout 500 is similar to the driver circuit layout 200. The driver circuit layout 500 comprises blocks of p-type MOS transistors 510 that collectively form the p-type driver 102 and blocks of n-type MOS transistors 520 that collectively form the n-type driver 104. The p-type MOS transistors 510 each comprise gates 530 that collectively correspond to the gate 106 (FIG. 1) and source regions 540 that collectively correspond to the source 108 (FIG. 1), the source regions connected to positive power line 110 (FIG. 1) and the gates connected to the first input line 118. The n-type MOS transistors 520 each comprise gates 550 that collectively correspond to the gate 118 (FIG. 1) and source regions 560 that collectively correspond to the source 122 (FIG. 1), the source regions connected to ground supply line 124 (FIG. 1) and the gates connected to a second input 120 (FIG. 1). The drain regions of both the n-type and p-type MOS transistors are connected to a drain wire 570 which in turn is connected to bond pad wire 580. Each drain wire 570 has blocks of p-type MOS transistors 510 on one side and each block of p-type MOS transistors has a corresponding block of n-type MOS transistors 520 on the other side. Unlike the embodiment of FIG. 2, the blocks of p-type MOS transistors 510 connected to a specific drain wire 570 are formed on both sides of the specific drain wire 570, opposite a corresponding block of n-type MOS transistors 520.

In some embodiments, the number of MOS transistors in the blocks 510, 520 is any number of MOS transistors compatible with embodiments of the disclosure, so long as each block of p-type MOS transistors 510 and the corresponding block of n-type MOS transistors 520 have the same number of transistors with similar on-resistance.

In the embodiment of FIG. 2, the difference between the number of n-type transistors 225 directly connected to a specific drain wire 270 and the number of p-type transistors 215 directly connected to the specific drain wire 270 between an end of the specific drain wire connected to the bond pad wire 280 and all distances along the specific drain wire 270 to the other end of the specific wiring 270 is zero. That is, equal numbers of n-type transistors 225 and p-type transistors 215 contribute to the average current flow along each portion of the specific drain wire 270. In the embodiment of FIG. 5, the same is true for a specific drain wire 570.

In other embodiments, the n-type transistors 225 and the p-type transistors 215 are arranged so that the number of n-type transistors directly connected to a specific drain wire and the number of p-type transistors 215 directly connected to the specific drain wire between an end of the specific drain wire connected to the bond pad wire 280 and all distances along the specific drain wire to the other end of the specific drain wire is close to but not zero. For example, in some embodiments, the difference between the number of n-type transistors 225 directly connected to a specific drain wire and the number of p-type transistors 215 at some points along the specific drain wire is one or two. This is accomplished by, for example, placing two or three n-type transistors 225 sequentially along the specific wiring 570 before the next p-type transistor 215 or vice versa. An imbalance of one or two n-type transistors and p-type transistors at points along the specific drain wire is acceptable, as long as the time average imbalance does not exceed the electro-migration limit of the specific drain wire at that point.

Figure 6:
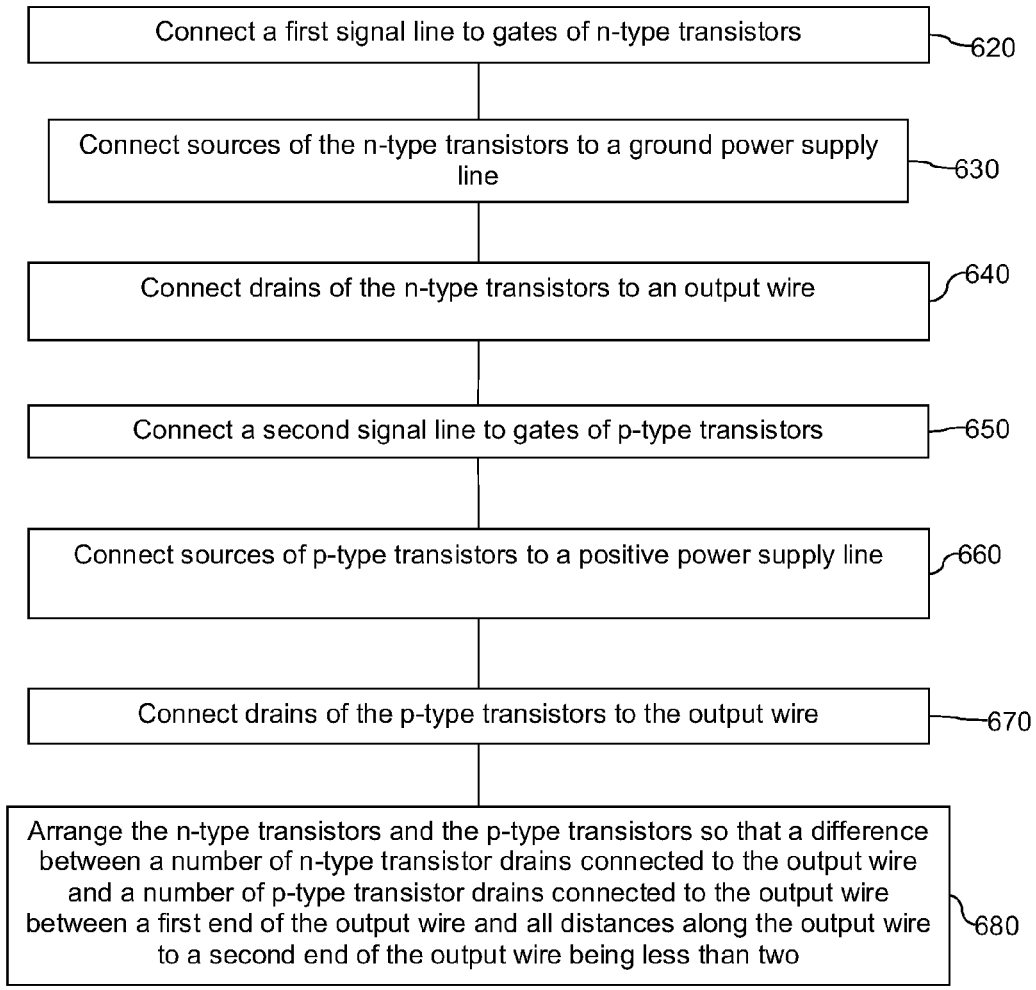
FIG. 6 is a flow chart of a method of driving a drain wire of a semiconductor chip.

FIG. 6 is a flow chart of a method 600 of laying out a driver of a semiconductor chip.

At step 620, a first input signal line is connected to gates 250 of n-type transistors 220. The method proceeds to step 630.

At step 630, the sources 260 of the n-type transistors are connected to a ground power line 124. The method proceeds to step 640.

At step 640, the drains 265 of the n-type transistors 220 are connected to a drain wire 270. The method proceeds to step 650.

At step 650, a second signal line is connected to gates 230 of the p-type transistors 210. The method proceeds to step 680.

At step 680, the sources 240 of the p-type transistors are connected to a positive power line 110. The method proceeds to step 670.

At step 670, the drains 262 of the p-type transistors 210 are connected to the drain wire 270. The method proceeds to step 680.

At step 680, the n-type transistors 220 and the p-type 210 transistors are arranged along the drain wire 270 so that a difference between a number of n-type transistor drains 265 connected to the drain wire and a number of p-type transistor drains 262 connected to the drain wire between a first end of the drain wire and all distances along the drain wire to a second end of the drain wire are less than two. In some embodiments, the n-type transistors 220 and the p-type transistors 210 are arranged along the drain wire 270 so that a time average current at any point flowing along the drain wire of the driver is substantially zero.

In other embodiments, at step 680 the n-type transistors 220 and a p-type transistors 210 are arranged in any of the arrangements described above with respect to the embodiments of FIGS. 1, 2 and 5 and the alternative embodiments described with respect to the embodiments of FIGS. 1, 2 and 5.

The above method is exemplary, and any order of the above method steps compatible with embodiments of the disclosure is within the scope of this disclosure. Further, methods comprising method steps in addition to the method steps discussed above, inserted before, between or after the above method steps are within the scope of this disclosure.

A driver for a semiconductor chip comprising, a drain wire, at least two n-type transistors, and at least two p-type transistors. The drain wire with a first end and a second end. The at least two n-type transistors each comprising, a source connected to a first power supply line, a gate connected to a first input line; and a drain directly connected to the drain wire. The at least two p-type transistors each comprising, a source connected to a second power supply line, a gate connected to a second input line, and a drain directly connected to the drain wire. The difference between the number of n-type transistors directly connected to the drain wire and the number of p-type transistors directly connected to the drain wire between the first end of the drain wire and all distances along the drain wire to the second end being less than two.

A driver for a semiconductor chip comprising, a drain wire, a first row of at least two transistors and a second row of at least two transistors. The first row of at least two transistors placed on one side of the drain wire, drains of the first row of transistors directly connected to the drain wire at regularly spaced positions along the drain wire, the transistors in the first row comprising at least one of n-type or p-type transistors. The second row of at least two transistors placed on the other side of the drain wire at regularly spaced positions along the drain wire, the drains of the second row of transistors directly connected to the drain wire, the transistors in the second row comprising at least one of n-type or p-type transistors. Each one of the n-type transistors in the first and the second rows pared with a one of the p-type transistors in the first or the second rows, the one of the p-type transistors not more than two of the regular spaced positions removed from the one of the n-type transistors.

A method of laying out a driver of a semiconductor chip comprising, connecting a first signal to gates of at least two n-type transistors, directly connecting drains of the at least two n-type transistors to a drain wire and connecting a second signal to gates of at least two p-type transistors, directly connecting drains of the at least two n-type transistors to the drain wire. The at least two n-type transistors and the at least two p-type transistors connected at positions along the drain wire such that a time average current at any point flowing along the drain wire is substantially zero.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A driver for a semiconductor chip comprising:
   a drain wire with a first end and a second end;
   at least two n-type transistors each comprising:
      a source connected to a first power supply line;
      a gate connected to a first input line; and
      a drain directly connected to the drain wire, wherein two of the at least two n-type transistors share a same source; and
   at least two p-type transistors each comprising:
      a source connected to a second power supply line;
      a gate connected to a second input line; and
      a drain directly connected to the drain wire;
   the difference between the number of n-type transistors directly connected to the drain wire and the number of p-type transistors directly connected to the drain wire between the first end of the drain wire and all distances along the drain wire to the second end being less than two.

2. The driver for the semiconductor chip according to claim 1, the difference between the number of n-type transistors connected to the drain wire and the number of p-type transistors connected to the drain wire between the first end of the drain wire and all distances along the drain wire being less than one.

3. The driver for the semiconductor chip according to claim 1, the at least two n-type transistors arranged on one side of the drain wire and the at least two p-type transistors arranged on the other side of the drain wire.

4. The driver for the semiconductor chip according to claim 1, each one of the at least two n-type transistors arranged on one side of the drain wire and a corresponding one of at least two p-type transistors arranged on the other side of the drain wire.

5. The driver for the semiconductor chip according to claim 4, each one of the at least two n-type transistors on one side of the drain wire separated from another of the at least two n-type transistors on the same side of the drain wire as one of the at least two p-type transistors.

6. The driver for the semiconductor chip according to claim 1, an on resistance of each of the at least two p-type transistors substantially the same as an on resistance of each of the at least two n-type transistors.

7. The driver for the semiconductor chip according to claim 1, the source of the at least two n-type transistors connected to the first power supply line via more than one metal layer.

8. The driver for the semiconductor chip according to claim 1, the source of the at least two p-type transistors connected to the second power supply line via more than one metal layer.

9. A driver for a semiconductor chip comprising:
   a drain wire;
   a first row of at least two transistors placed on one side of the drain wire, drains of the first row of transistors directly connected to the drain wire at regularly spaced positions along the drain wire, the transistors in the first row comprising at least one of n-type or p-type transistors; and
   a second row of at least two transistors placed on the other side of the drain wire at regularly spaced positions along the drain wire, the drains of the second row of transistors directly connected to the drain wire, the transistors in the second row comprising at least one of n-type or p-type transistors;
   each one of the n-type transistors in the first and the second rows paired with one of the p-type transistors in the first or the second rows, the one of the p-type transistors not more than two of the regular spaced positions removed from the one of the n-type transistors.

10. The driver for the semiconductor chip according claim 9, each one of the n-type transistors in the first and the second rows paired with a one of the p-type transistors in the first or the second rows not more than one of the regular spaced positions from the one of the n-type transistors.

11. The driver for the semiconductor chip according to claim 9, the first row comprising the n-type transistor of each pair and the second row comprising the p-type transistor of each pair.

12. The driver for the semiconductor chip according to claim 9, the first row comprising the n-type transistor or p-type transistor of each pair at a one of the regular spaced positions and the second row comprising the other transistor of the pair at the same regular spaced position.

13. The driver for the semiconductor chip according to claim 12, the drain wire formed on a metal layer closest to a substrate of the semiconductor chip.

14. The driver for the semiconductor chip according to claim 9, further comprising setting an on-resistance of each of the at least two p-type transistors to be substantially the same as an on resistance of each of the at least two n-type transistors.

15. The driver for the semiconductor chip according to claim 9, sources of the n-type transistors connected to a first power supply line via more than one metal layer of the semiconductor chip.

16. The driver for the semiconductor chip according to claim 9, sources of the p-type transistors connected to a second power supply line via more than one metal layer of the semiconductor chip.

17. A method of laying out a driver of a semiconductor chip comprising:
- connecting a first signal to gates of at least two n-type transistors;
- directly connecting drains of the at least two n-type transistors to a drain wire;
- connecting a second signal to gates of at least two p-type transistors;
- directly connecting drains of the at least two n-type transistors to the drain wire, wherein at least one of the at least two p-type transistors is on a same side of the drain wire as at least one of the at least two n-type transistors;
- the at least two n-type transistors and the at least two p-type transistors connected at positions along the drain wire such that a time average current at any point flowing along the drain wire is substantially zero.

18. The method according to claim 17, further comprising arranging the at least two n-type transistors on one side of the drain wire, and the at least two p-type transistors on the other one side of the drain wire.

19. The method according to claim 17, further comprising arranging each one of the at least two n-type transistors on one side of the drain wire and arranging a corresponding one of the at least two p-type transistors on the other side the drain wire.

20. The method according to claim 19, each one of the at least two n-type transistors on one side of the drain wire separated from another of the at least two n-type transistors on the same side of the drain wire by a one of the at least two p-type transistors.

* * * * *